United States Patent
Kim et al.

(10) Patent No.: US 7,074,718 B2
(45) Date of Patent: Jul. 11, 2006

(54) METHOD OF FABRICATING A SEMICONDUCTOR DEVICE HAVING A BURIED AND ENLARGED CONTACT HOLE

(75) Inventors: Seong-Goo Kim, Seoul (KR); Sang-Moo Jeong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 46 days.

(21) Appl. No.: 10/898,485

(22) Filed: Jul. 22, 2004

(65) Prior Publication Data

US 2005/0017295 A1    Jan. 27, 2005

(30) Foreign Application Priority Data

Jul. 25, 2003    (KR)    ...................... 10-2003-0051658

(51) Int. Cl.
*H01L 21/4763*    (2006.01)
*H01L 21/336*    (2006.01)
*H01L 21/331*    (2006.01)
*H01L 21/302*    (2006.01)
*H01L 21/461*    (2006.01)

(52) U.S. Cl. ...................... 438/639; 438/262; 438/700; 438/734; 438/735

(58) Field of Classification Search ................ 438/253, 438/256–257, 262, 396, 399, 622–640, 700, 438/734–735, 739

See application file for complete search history.

(56) References Cited

U.S. PATENT DOCUMENTS

| | | | |
|---|---|---|---|
| 6,383,857 B1 | 5/2002 | Terauchi et al. | |
| 6,777,305 B1* | 8/2004 | Lee et al. | ................... 438/396 |
| 2002/0079536 A1 | 6/2002 | Terauchi et al. | |
| 2004/0014278 A1* | 1/2004 | Lee et al. | ................... 438/239 |
| 2004/0046251 A1* | 3/2004 | Lee | ............. 257/734 |
| 2004/0188806 A1* | 9/2004 | Chung et al. | ............... 257/621 |

FOREIGN PATENT DOCUMENTS

KR    2002-0002680    1/2002

OTHER PUBLICATIONS

English language abstract of Korean Publication No. 2002-0002680.

* cited by examiner

*Primary Examiner*—Thanhha Pham
(74) *Attorney, Agent, or Firm*—Marger Johnson & McCollom, P.C.

(57) ABSTRACT

According to embodiments of the invention, a bit line interlayer insulating layer is placed over a semiconductor substrate. Two adjacent bit line patterns are placed in parallel on the bit line interlayer insulating layer and each of the two adjacent bit line patterns includes a bit line and a bit line capping layer pattern stacked thereon. A buried contact interlayer insulating layer covers a surface of the semiconductor substrate having the two adjacent bit line patterns. A contact hole is placed in a portion between the bit line patterns to penetrate the buried contact interlayer insulating layer and the bit line interlayer insulating layer and to expose at least one side wall of the bit line patterns. A contact hole spacer covers side wall of the contact hole. A contact hole plug is placed on the contact hole spacer to fill the contact hole.

18 Claims, 19 Drawing Sheets

METHOD OF FABRICATING A SEMICONDUCTOR DEVICE HAVING A BURIED AND ENLARGED CONTACT HOLE

CROSS-REFERENCE TO RELATED APPLICATION

This patent application claims priority from Korean Patent Application No. 10-2003-0051658, filed Jul. 25, 2003, the contents of which are hereby incorporated by reference in their entirety.

BACKGROUND OF THE INVENTION

1. Field of the Invention

This disclosure relates to semiconductor devices and methods of fabricating the same and, more particularly, to semiconductor devices having a buried and enlarged contact hole and methods of fabricating the same.

2. Description of the Related Art

In general, in order to improve a design performance goals such as high integration and high speeds, a semiconductor device is fabricated such that an arrangement of a semiconductor circuit formed on a semiconductor substrate is changed or a certain circuit is added to an existing semiconductor circuit.

High integration is obtained by reducing a design rule, and through this reduction a high speed can be implemented. Reduction of a design rule involves decreasing the size of a pitch between components of a semiconductor device. However, due to the reduction of the design rule, a photolithography process may not be stably performed on a semiconductor substrate. This is because light passing through a photo mask during a photolithography process causes more severe dispersion and interference on a semiconductor substrate having a photo resist film than before the reduction of a design rule.

Changing the arrangement of the semiconductor circuit to improve a design performance adds an extra burden to a fabricating process because the photolithography process condition should be set again before and after a circuit arrangement changes in consideration of a process margin between a cell array region and a peripheral circuit region. Adding the certain circuit to the existing semiconductor circuit requires a previous work that makes out a design rule of a desired semiconductor device and then trains again an engineer portions to be monitored a semiconductor substrate. Therefore, methods of changing the arrangement of the semiconductor circuit and adding the certain circuit to the existing semiconductor circuit need much efforts and time of engineers related to fabrication of a semiconductor device.

Recently, many resolutions to increase a design performance by using a semiconductor fabrication process have been suggested. Such resolutions relate to introducing a new material or changing a shape of components of a semiconductor device. Introducing new material decreases a resistance of the circuit wire, thereby improving a wiring capability of a semiconductor device. Changing a shape of components of a semiconductor device maximizes an electrical capability of components, thereby doubling the driving ability of a semiconductor device.

On the other hand, U.S. Pat. Publication No. 2002-79536 to Takashi Terauchi et al. disclosed a semiconductor device that improves design performance by changing the shape of components of a semiconductor device.

According to the U.S. Pat. Publication No. 2002-79536, the semiconductor device comprises lower and upper interlayer insulating layers sequentially placed on a semiconductor substrate, and two adjacent wires are placed between the lower and upper interlayer insulating layers. The lower and upper interlayer insulating layers are oxide films, and each of the wires has a silicon nitride layer pattern, a conductive layer pattern, and a capping layer pattern that are stacked in sequence. The wires can be used as bit line wires in a DRAM cell array region. Spacers are placed on side walls of the wires, and the spacers and the capping layer pattern are silicon nitride layers.

Next, a first contact hole is placed to be self-aligned between the wires by penetrating a predetermined region of the lower and upper interlayer insulating layers, exposing a portion of the semiconductor substrate. By using the first contact hole, the lower and upper interlayer insulating layers are wet-etched to form a second contact hole having a diameter larger than a distance between the wires. Here, the conductive layer pattern is not exposed by the wet etching process and is subsequently surrounded by the silicon nitride layer pattern, the capping layer pattern, and the spacers. A contact plug is placed to fill the second contact hole, and the contact plug is a conductive layer. Therefore, the semiconductor device having the second contact hole can reduce a contact resistance between the contact plug and the semiconductor substrate compared with a case having the first contact hole.

However, when the size of a pitch between the two wires is reduced due to reduction of a design rule of the semiconductor device, it is difficult to lower a contact resistance between the contact plug and the semiconductor substrate by using the second contact hole. Also, since the first contact hole is formed by using the spacers placed on the side walls of the wires, it is more difficult to form second contact hole having the diameter larger than the distance between the wires.

Embodiments of the invention address these and other disadvantages of the conventional art.

SUMMARY OF THE INVENTION

According to some embodiments of the invention, there is provided semiconductor devices having a buried and enlarged contact hole and methods of fabricating the same. The buried and enlarged contact hole is a contact hole having a diameter larger than a distance between bit lines. The semiconductor device having the buried and enlarged contact hole can decrease the contact resistance between a landing pad and a buried and enlarged contact hole plug, improving design performance.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION OF THE INVENTION

Figure 1:
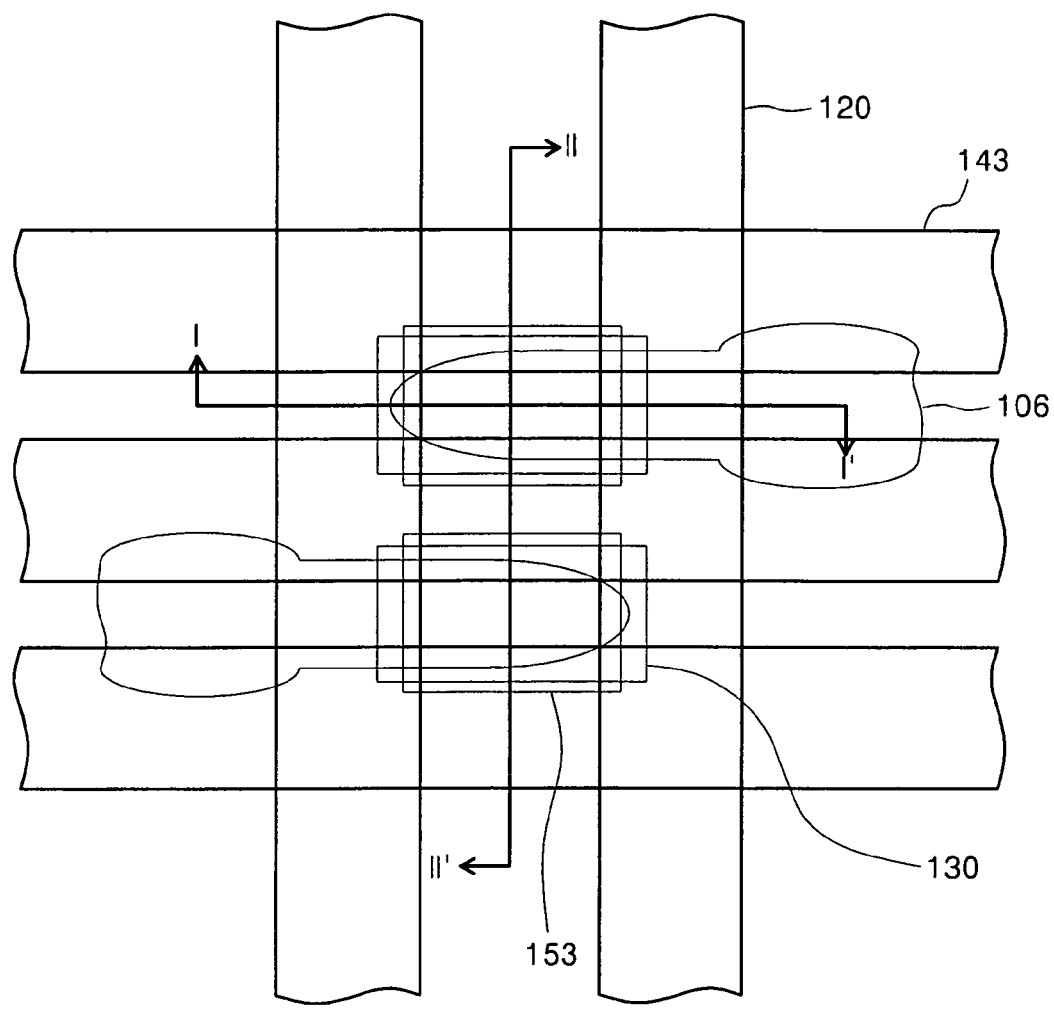
FIG. 1 is a plan view illustrating a semiconductor device according to some embodiments of the invention.
Figure 2:
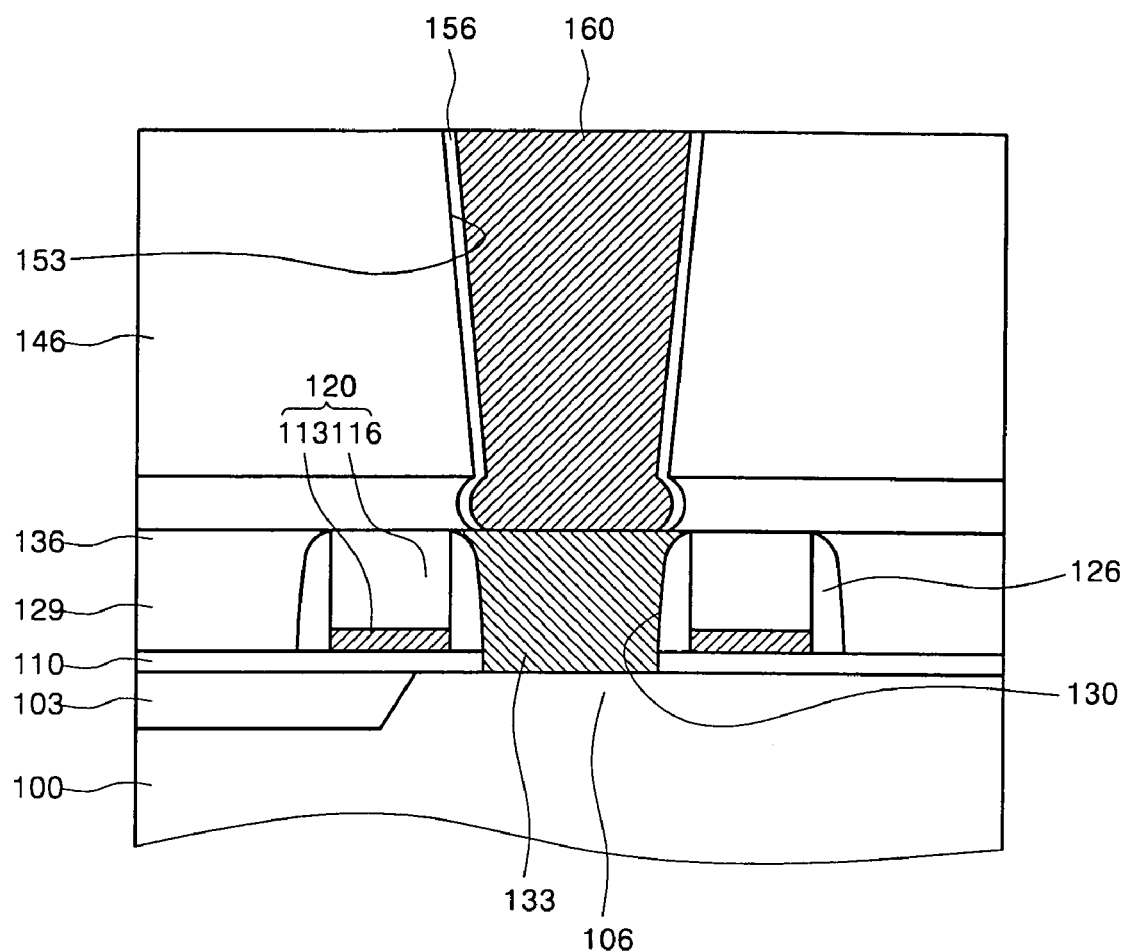
FIGS. 2 and 3 are cross-sectional views taken along lines I–I' and II–II' of FIG. 1, respectively.
Figure 3:
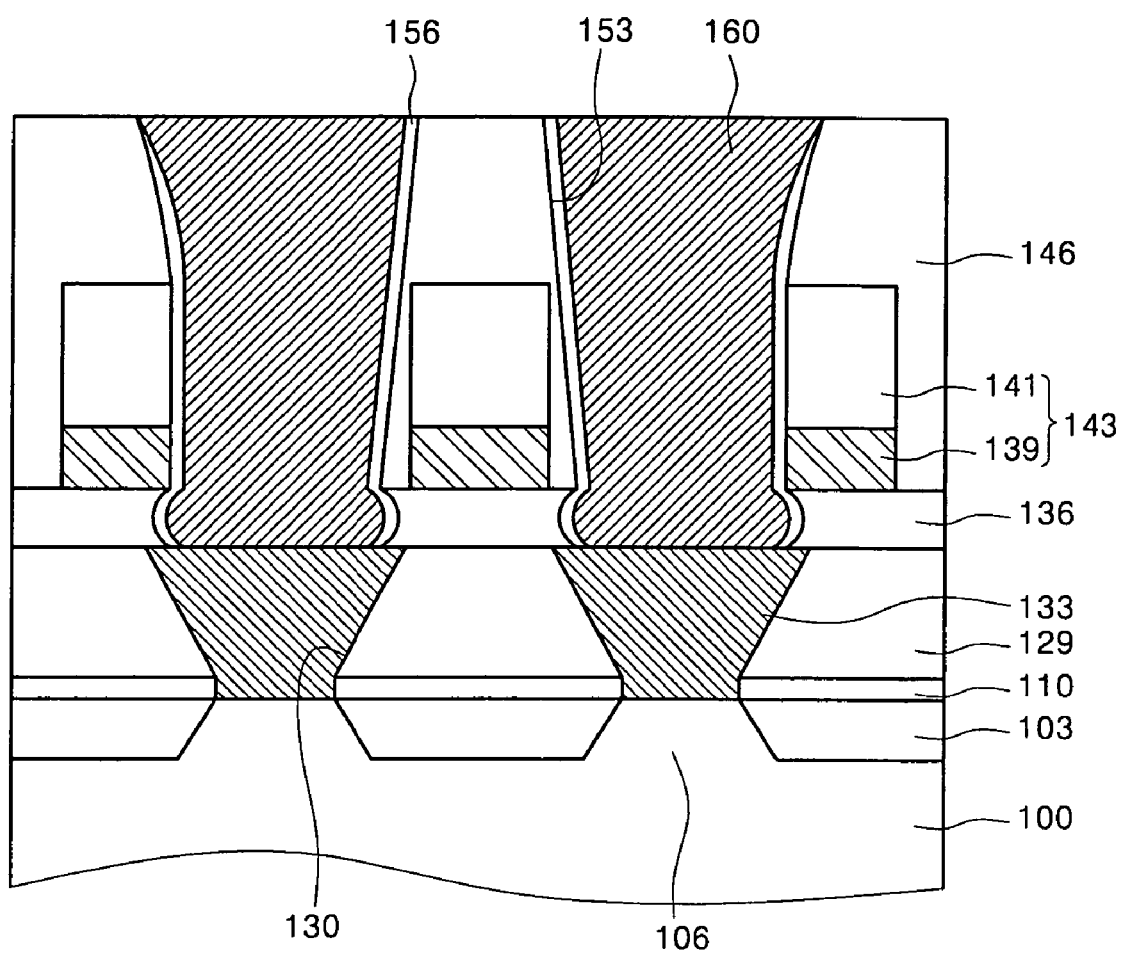

FIG. 1 is a plan view illustrating a semiconductor device according to some embodiments of the invention. FIGS. 2 and 3 are cross-sectional views taken along lines I–I' and II–II' of FIG. 1, respectively.

Referring to FIGS. 1 to 3, a trench isolation layer 103 is placed on a predetermined region of a semiconductor substrate 100 to define an active region 106. A gate insulating layer 110 is formed over the semiconductor substrate 100 having the trench isolation layer 103 and the active region 106. Two adjacent gate patterns 120 are placed on the gate insulating layer 110 to traverse the active regions 106. Gate spacers 126 cover side walls of the gate patterns 120. Each of the gate patterns 120 includes a gate 113 and a gate capping layer pattern 116 stacked thereon. The gate 113 comprises an N-doped poly silicon layer, and the gate capping layer pattern 116 and the gate spacer 126 include a silicon nitride layer.

Next, a pad interlayer insulating layer 129 is placed to cover side walls of the gate spacers 126, filling a gap region between the gate patterns 120. The pad interlayer insulating layer 129 includes an oxide layer having an etching selectivity ratio different from the trench isolation layer 103. Pad holes 130 are placed in a predetermined region between the gate patterns 120 to penetrate the pad interlayer insulating layer 129 and the gate insulating layer 110, thereby exposing a portion of the semiconductor substrate 100. The pad holes 130 are filled with landing pads 133. The landing pads 133 include an N-doped poly silicon layer. A bit line interlayer insulating layer 136 covers the semiconductor substrate 100 having the landing pads 133, and bit line patterns 143 are placed on the bit line interlayer insulating 136. Each of the bit line patterns 143 includes a bit line 139 and a bit line capping layer pattern 141 stacked thereon. The bit line 139 includes an N-doped poly silicon layer, a polycide layer or a metal layer, and the bit line capping layer pattern 141 includes a silicon nitride layer.

Subsequently, a buried contact interlayer insulating layer 146 covers the semiconductor substrate 100 having the bit line patterns 143. The buried contact interlayer insulating layer 146 includes an oxide layer having an etching selectivity ratio different from the bit line interlayer insulating layer 136. Here, the buried contact interlayer insulating layer 146 has a low etching selectivity ratio to the bit line interlayer insulating layer 136. Buried and enlarged contact holes 153 are placed in a predetermined region between the bit line patterns 143 to penetrate the buried contact interlayer insulating layer 146 and the bit line interlayer insulating layer 136. Each of the buried and enlarged contact holes 153 exposes at least one of side walls of the two bit line patterns 143 adjacent thereto and an upper surface of the landing pad 133. The at least one bit line pattern 143 exposed in the buried and enlarged contact hole 153 is smaller in width than a non-exposed bit line pattern surrounded by the buried contact interlayer insulating layer 146. Buried and enlarged contact hole spacers 156 cover side walls of the buried and enlarged contact holes 153. The buried and enlarged contact hole 153 surrounded by the buried and enlarged contact hole spacers 156 is filled with buried and enlarged contact hole plugs 160. The buried and enlarged contact hole plug 160 includes an N-doped poly silicon layer, and the buried and enlarged contact hole spacer 156 includes a silicon nitride layer.

FIGS. 4, 6, 8, 10, 12, 14, 16, 18, and 20 are cross-sectional views illustrating a process of fabricating the semiconductor device according to some embodiments of the invention, taken along line I–I' of FIG. 1, respectively. FIGS. 5, 7, 9, 11, 13, 15, 17, 19 and 21 are cross-sectional views illustrating a process of fabricating the semiconductor device according to some embodiments of the invention, taken along line II–II' of FIG. 1, respectively.

Figure 4:
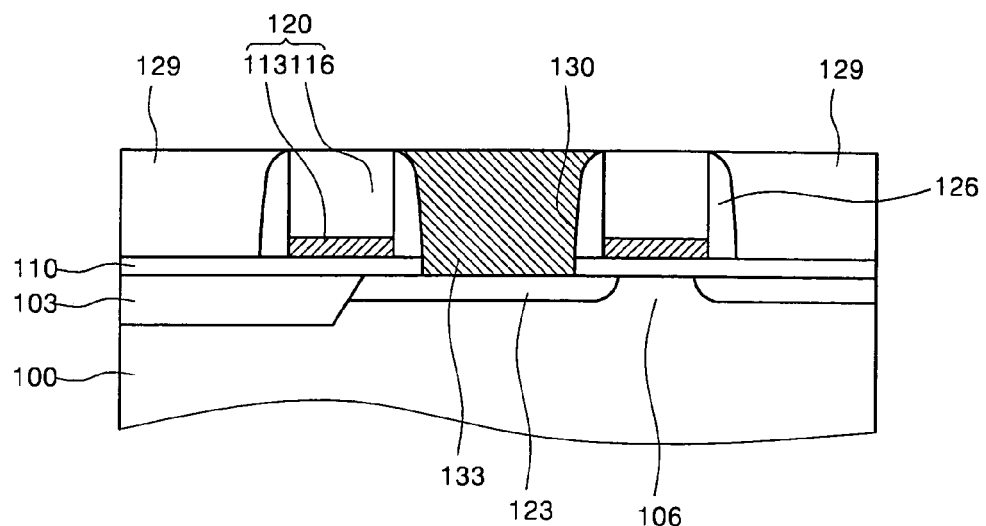
FIGS. 4, 6, 8, 10, 12, 14, 16, 18 and 20 are cross-sectional views illustrating a process of fabricating the semiconductor device according to some embodiments of the invention, taken along line I–I' of FIG. 1.
Figure 5:
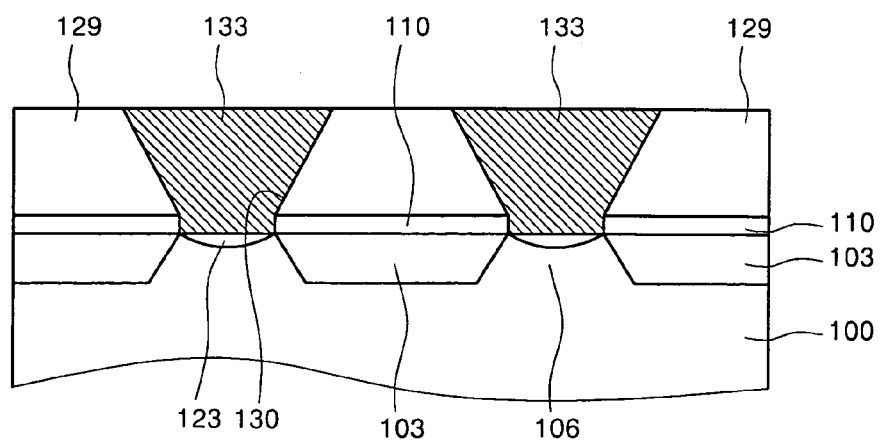
FIGS. 5, 7, 9, 11, 13, 15, 17, 19 and 21 are cross-sectional views illustrating a process of fabricating the semiconductor device according to some embodiments of the invention, taken along line II–II' of FIG. 1.
Figure 6:
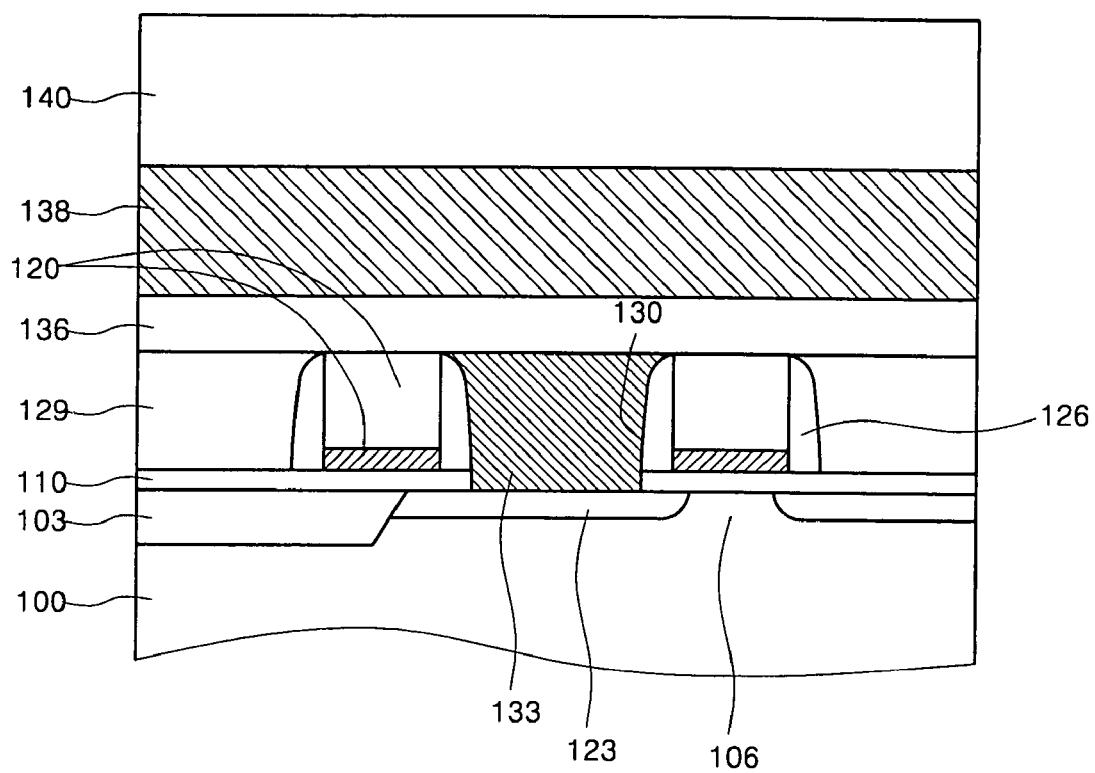
Figure 7:
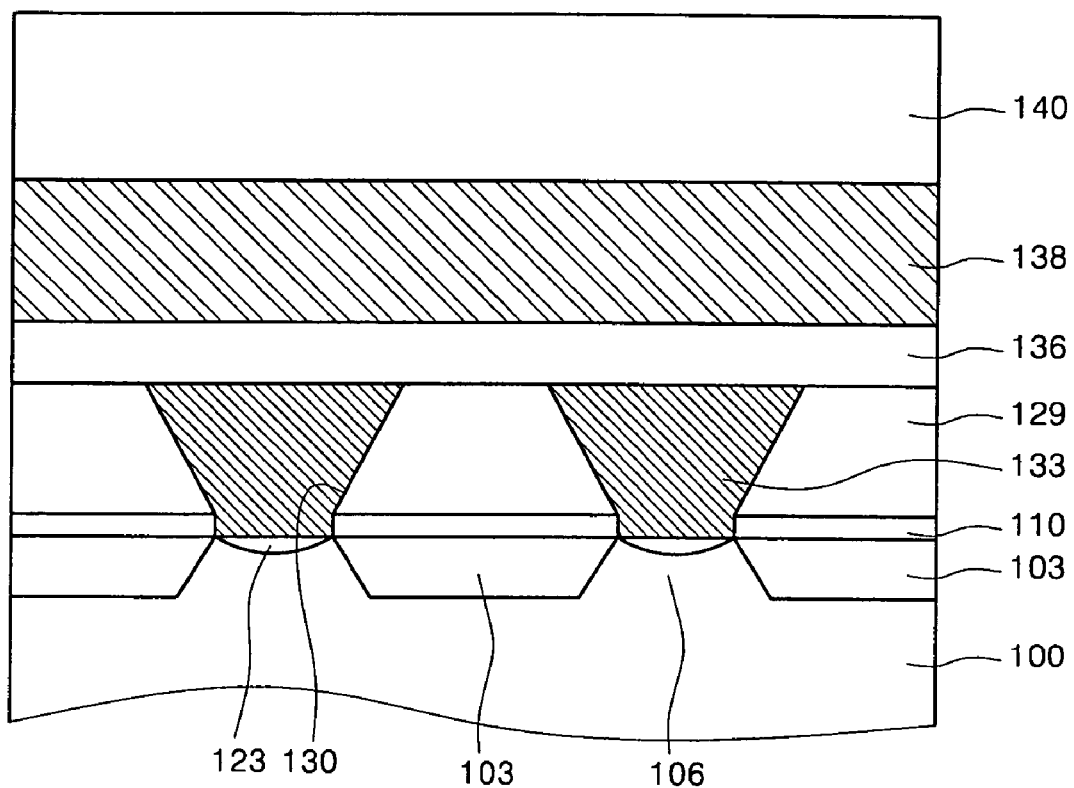
Figure 8:
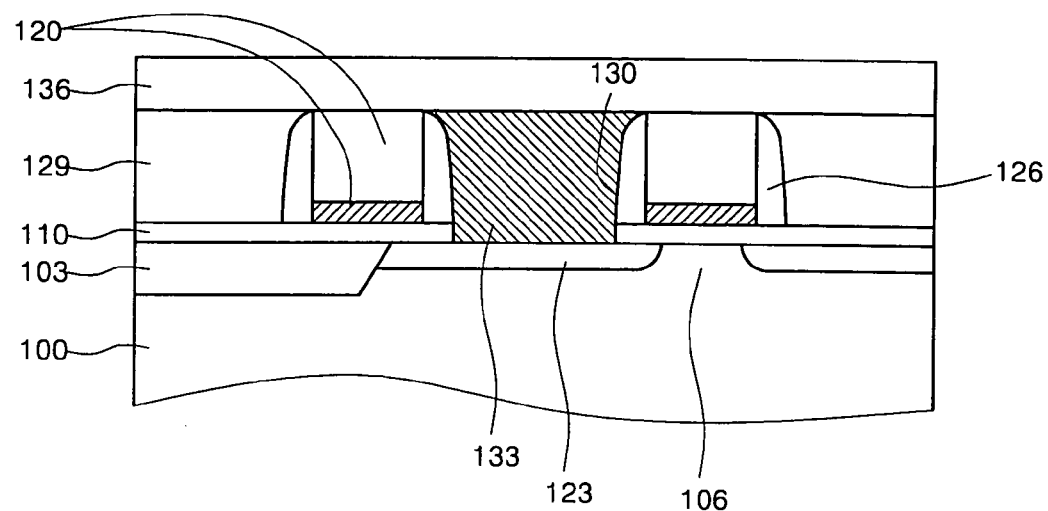
Figure 9:
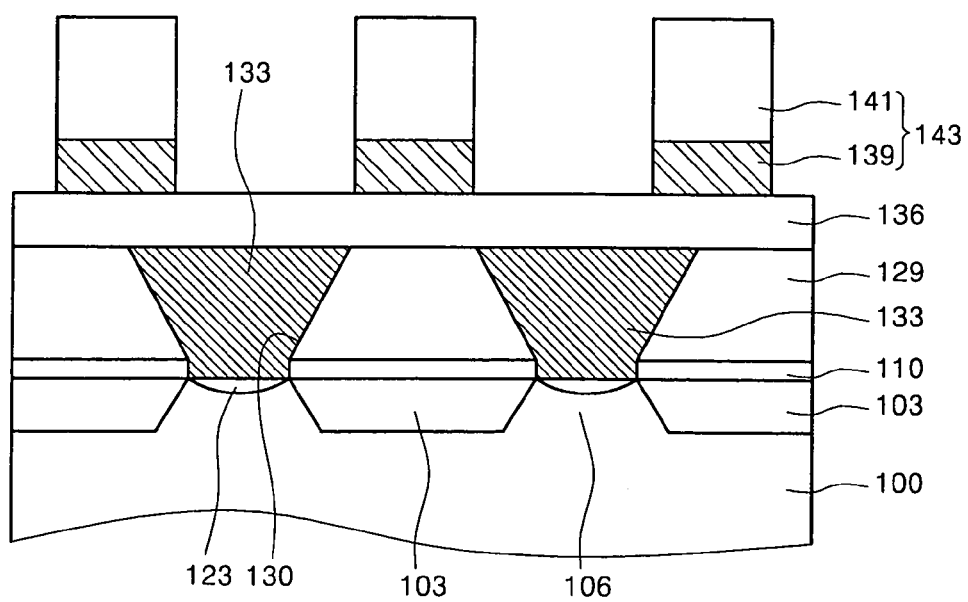
Figure 10:
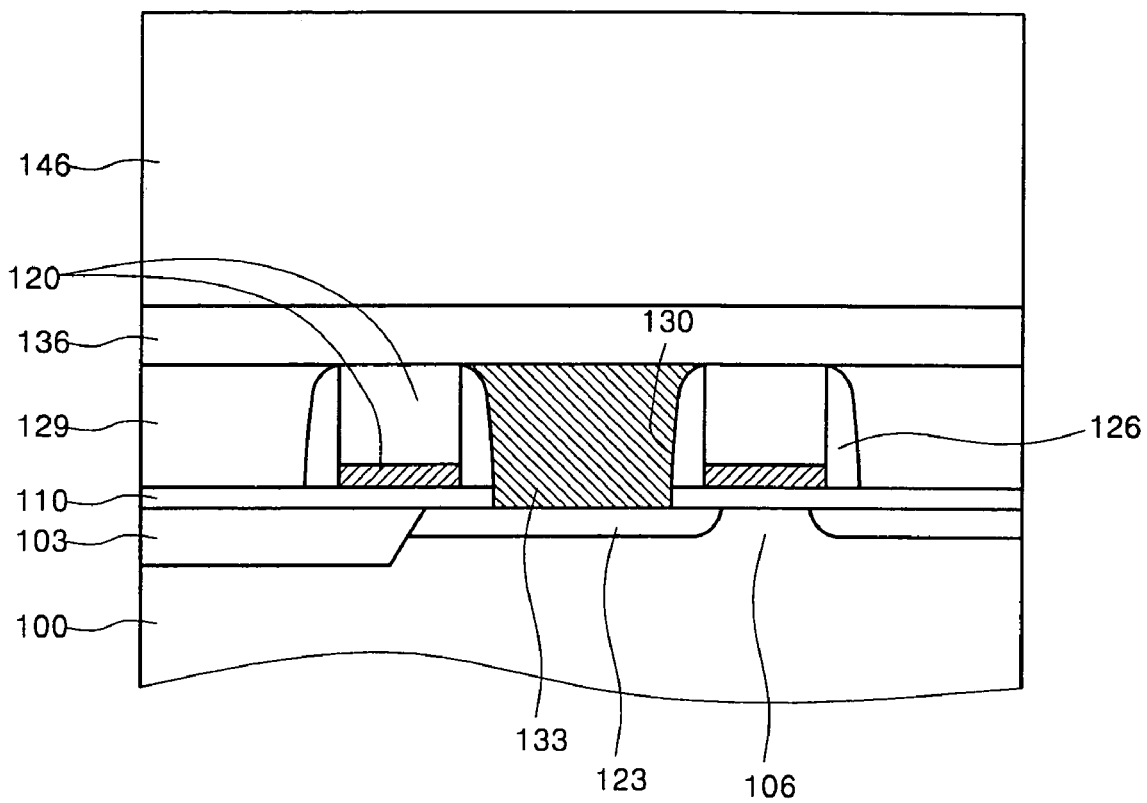
Figure 11:
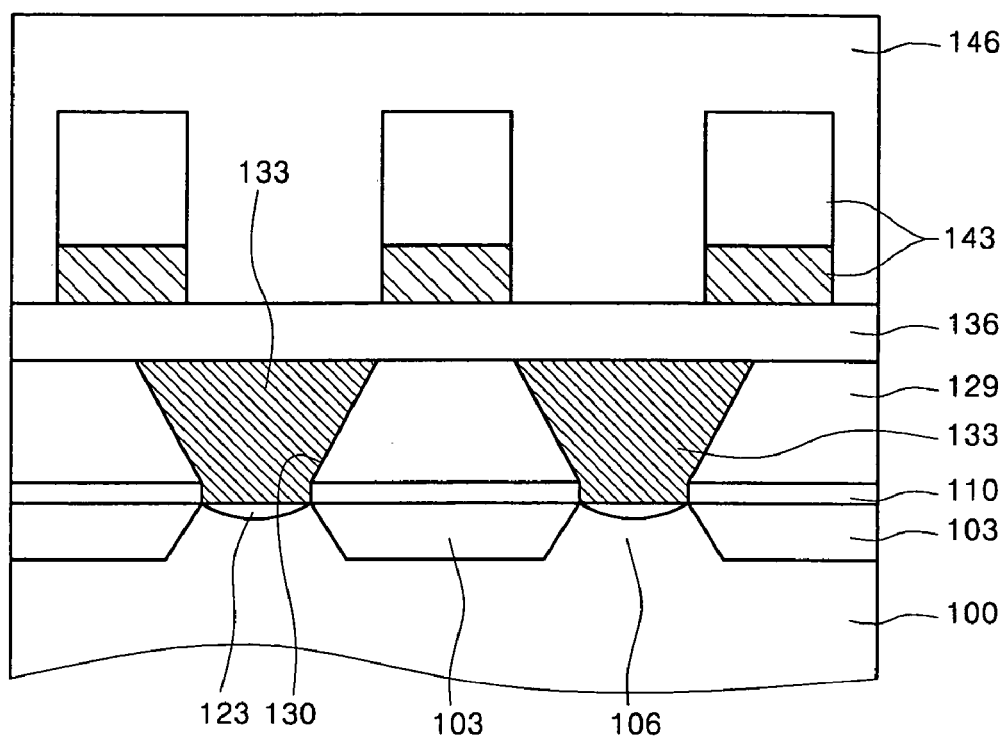
Figure 12:
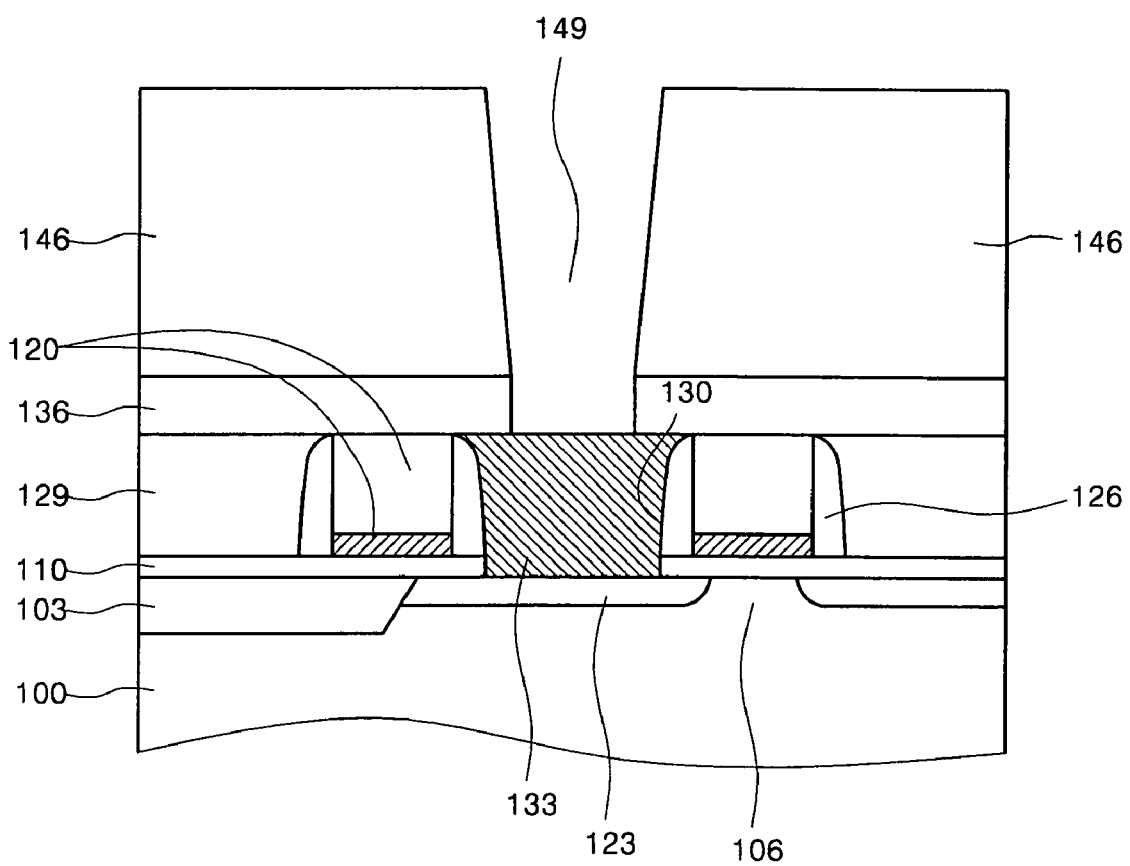
Figure 13:
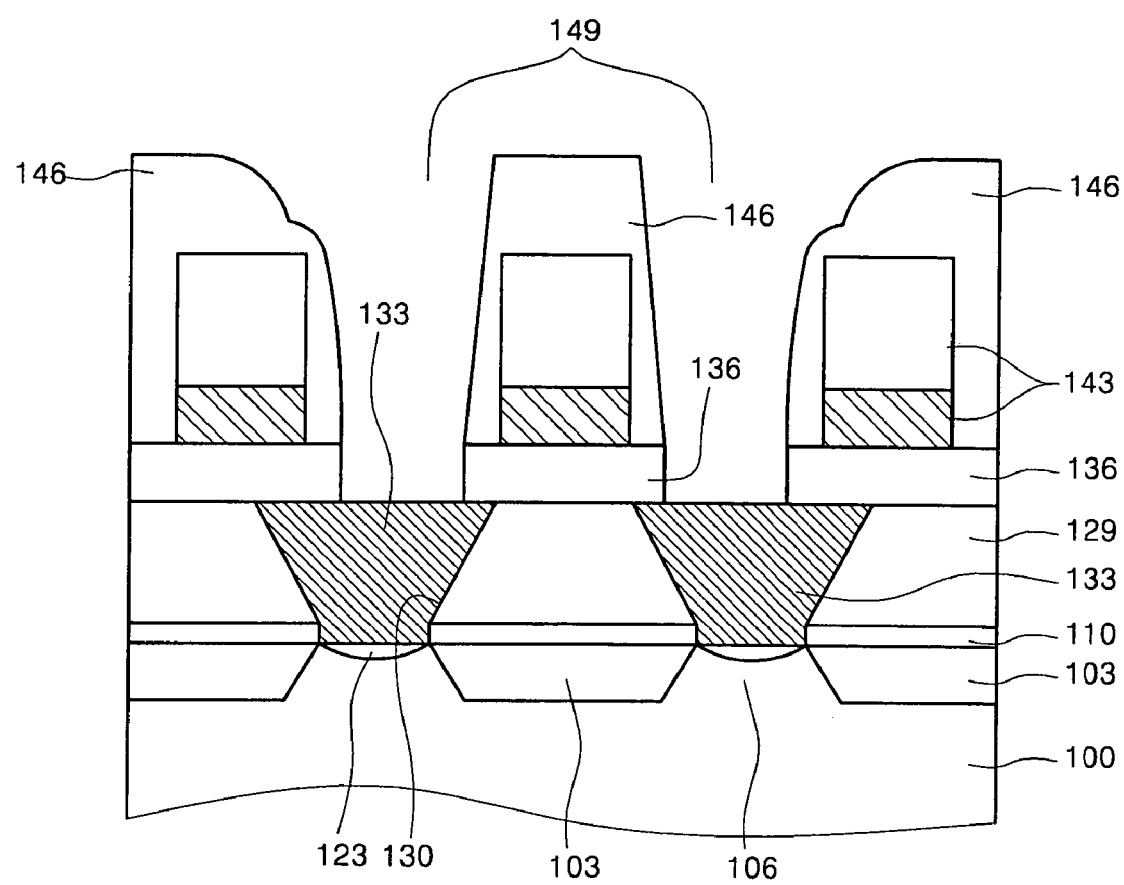
Figure 14:
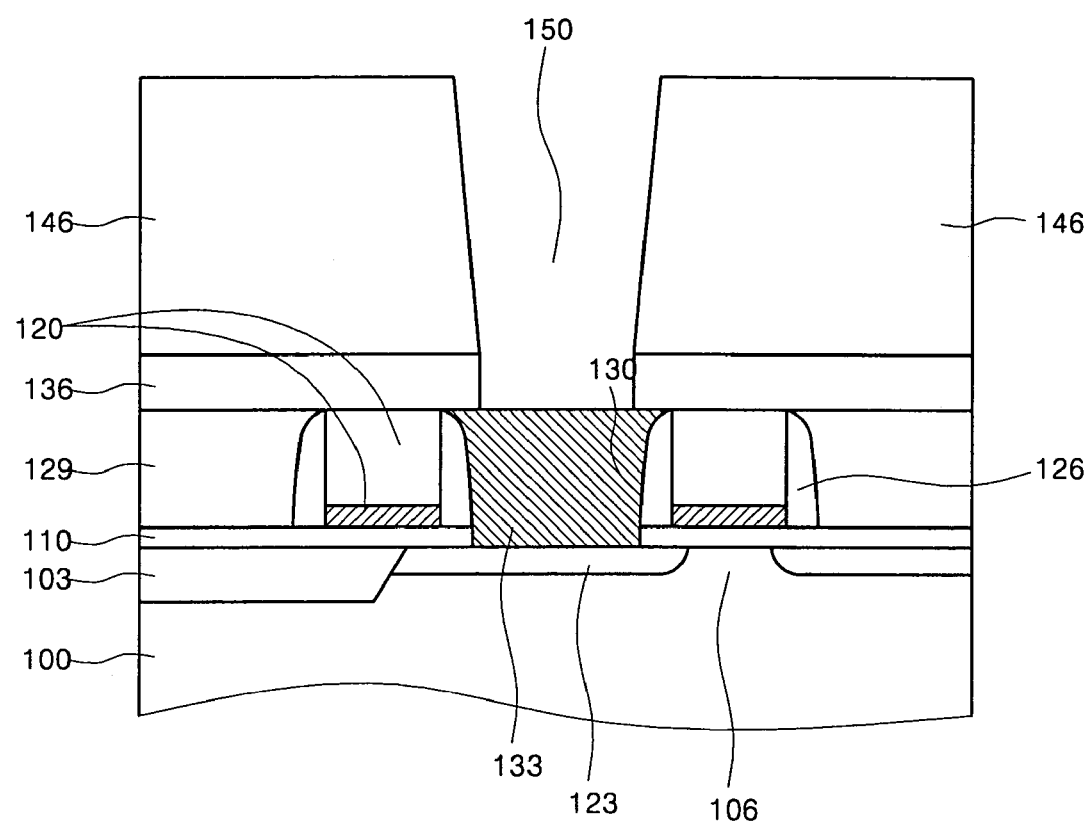
Figure 15:
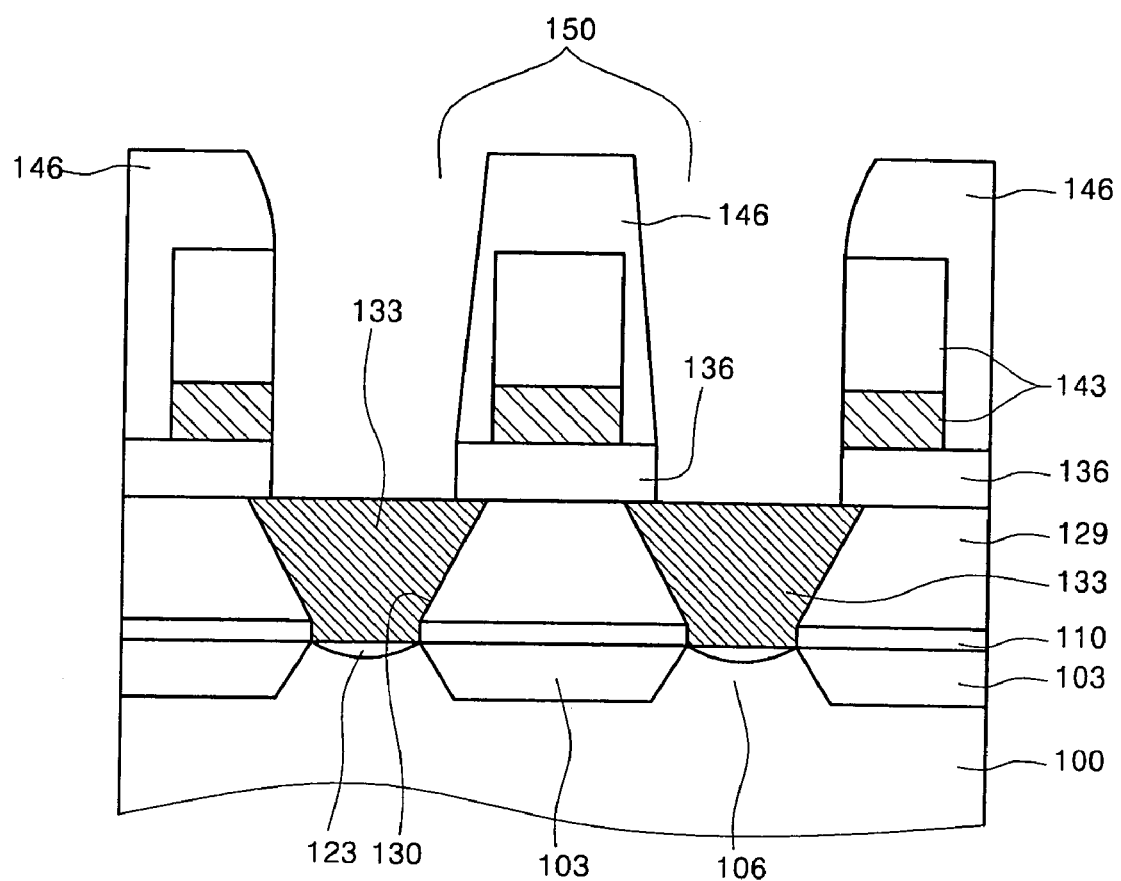
Figure 16:
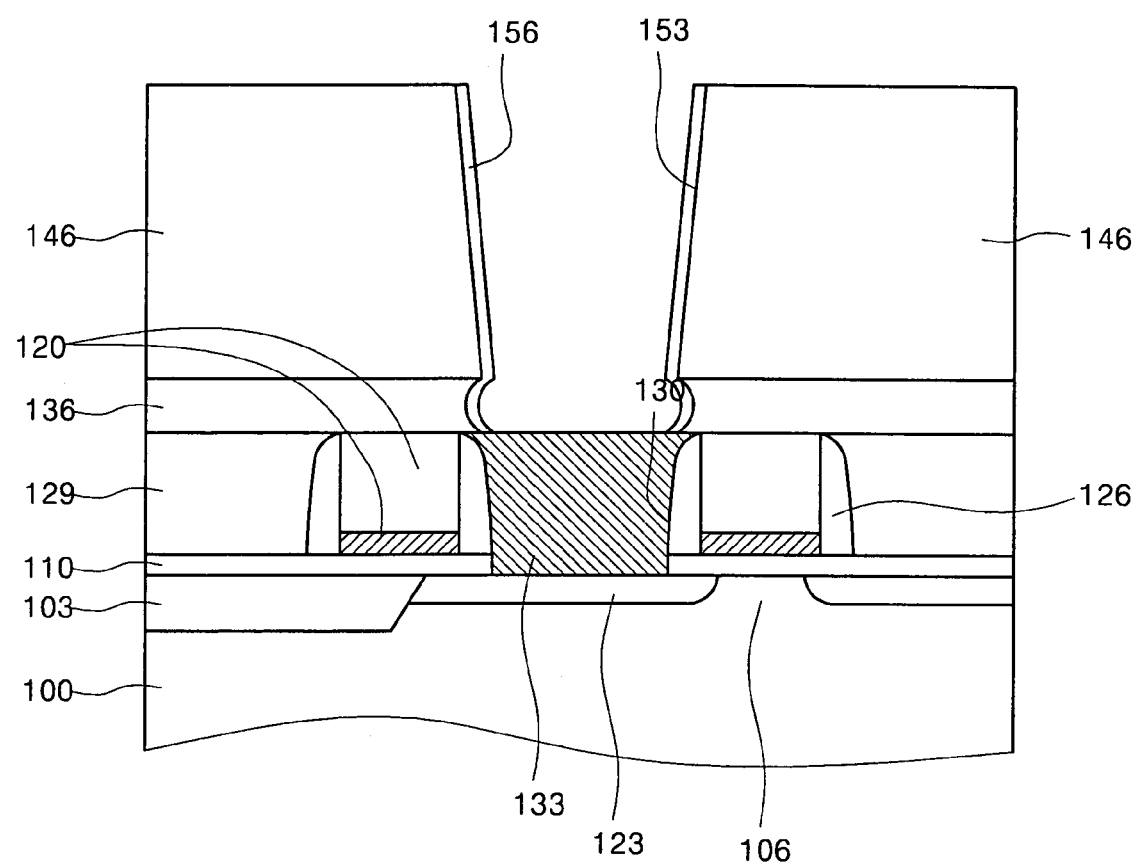
Figure 17:
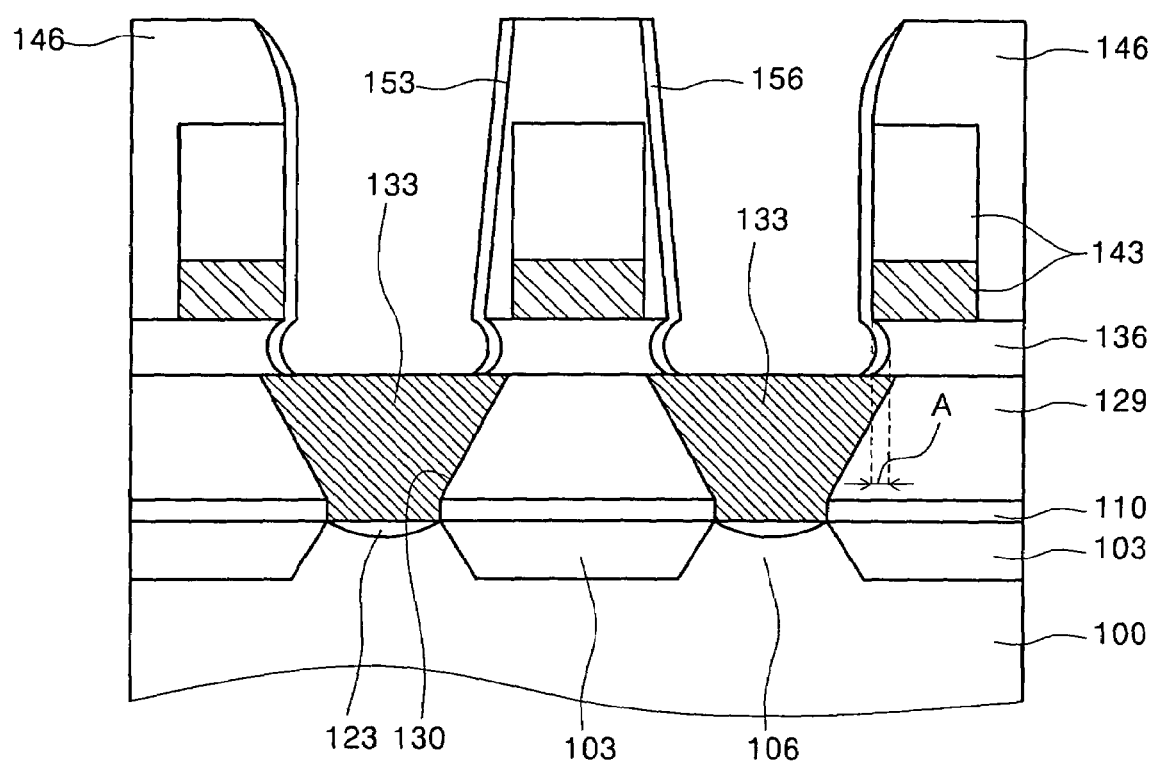
Figure 18:
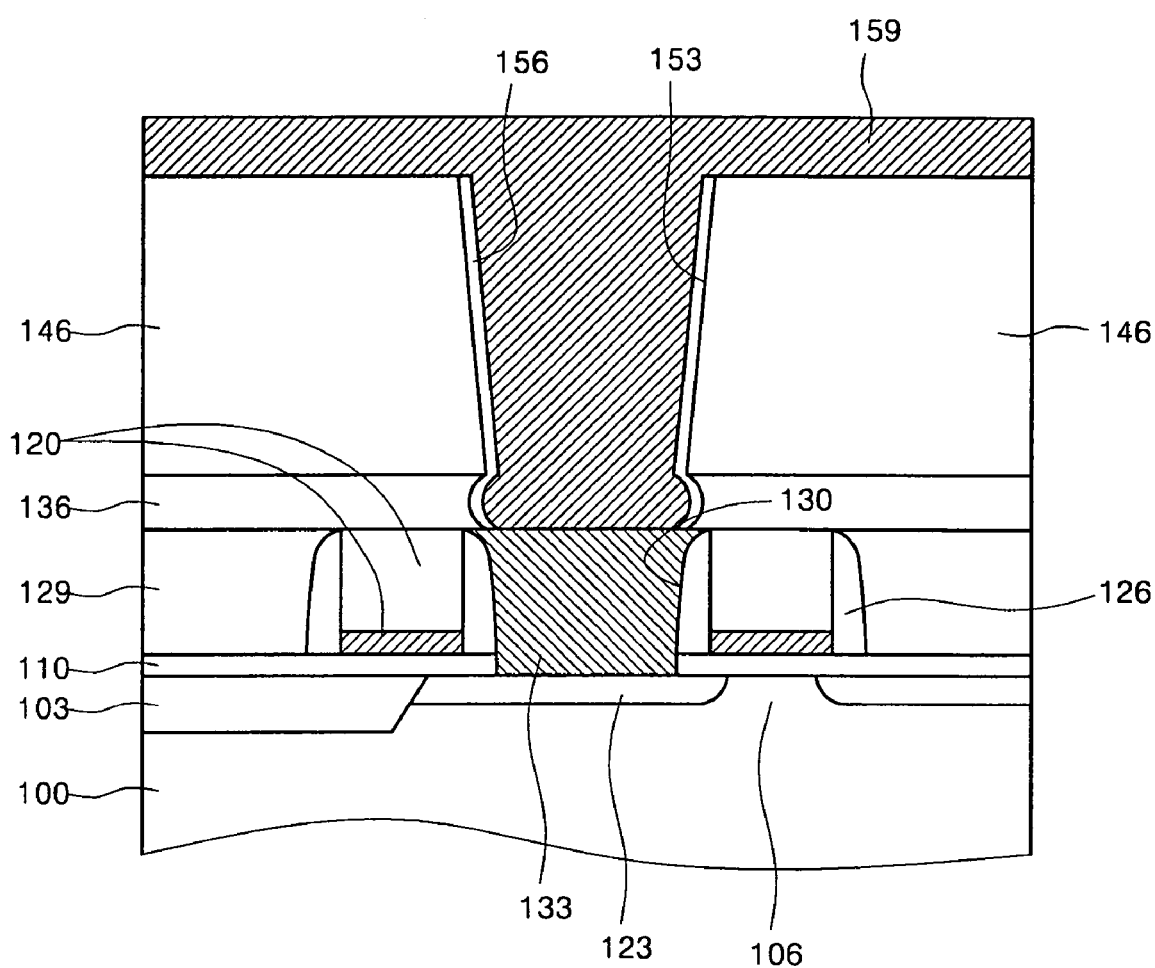
Figure 19:
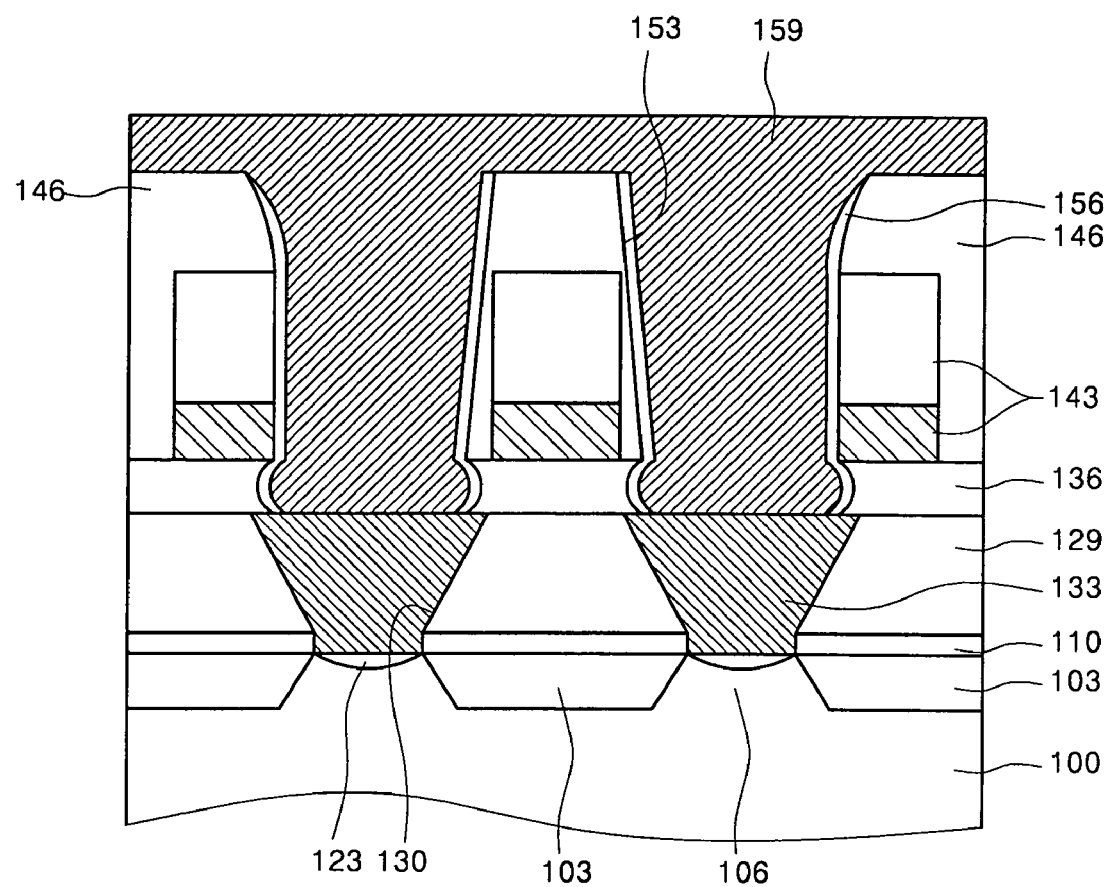
Figure 20:
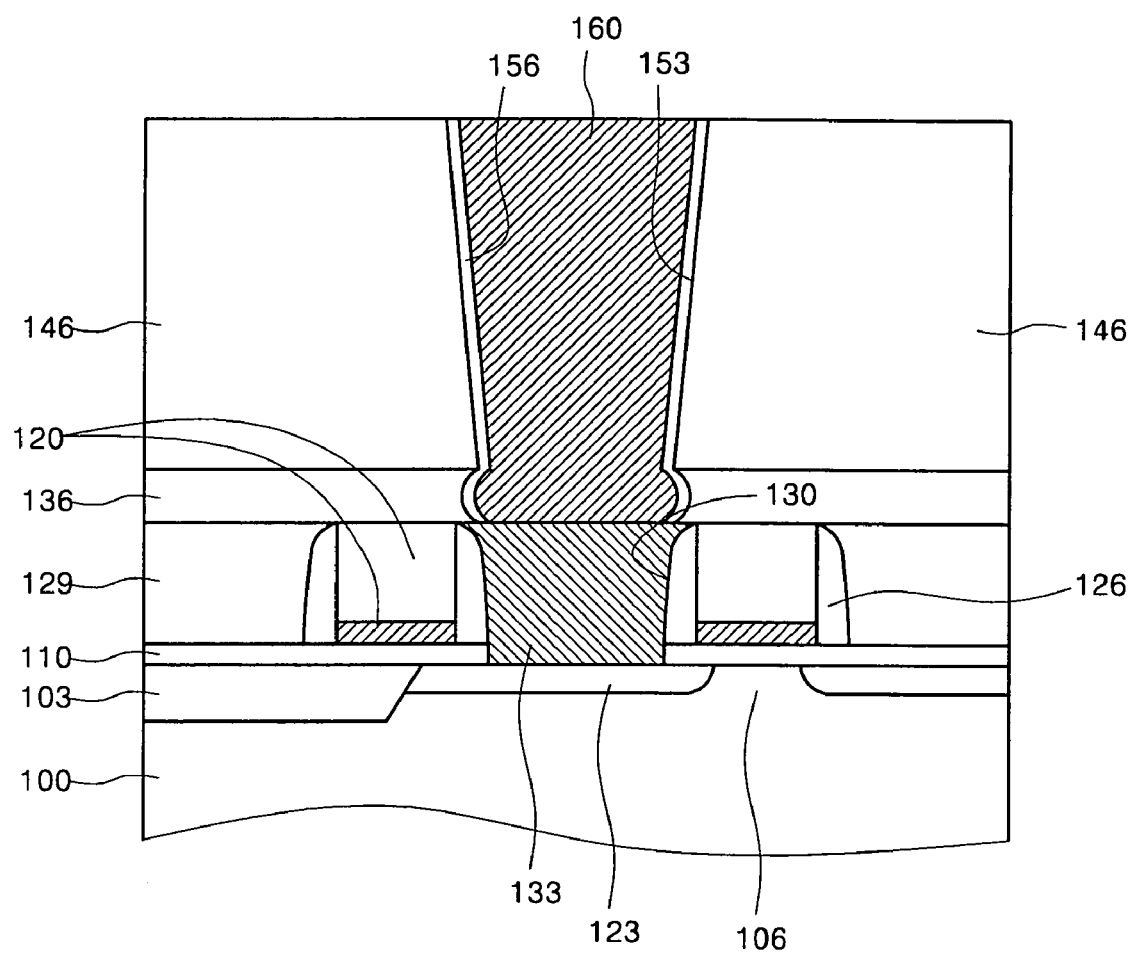
Figure 21:
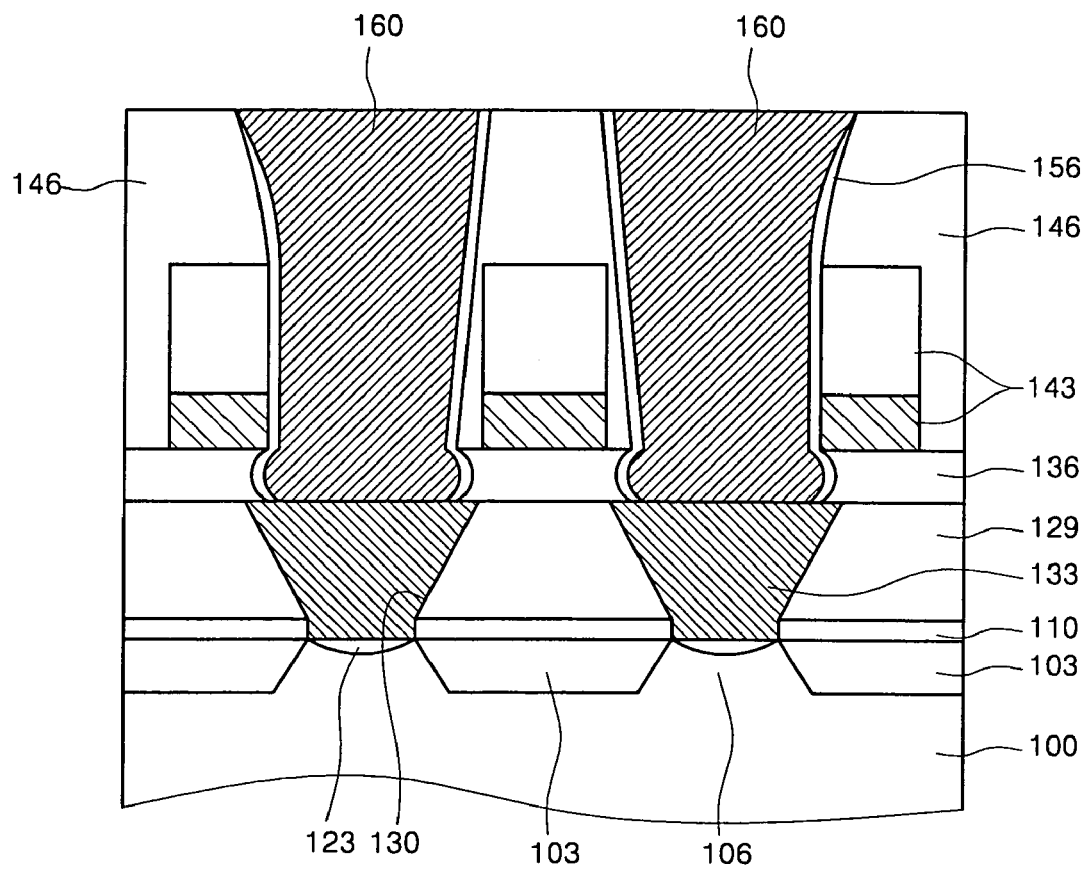

Referring to FIGS. 1, 4 and 5, a trench isolation layer 103 is formed on a predetermined region of a semiconductor substrate 100, thereby isolating an active region 106. A gate insulating layer 110 is formed over the whole surface of the semiconductor substrate 100 having the trench isolation layer 103. Two gate patterns 120 are formed adjacent to each other on the gate insulating layer 110. Each of the gate patterns 120 is formed from a gate 113 and a gate capping layer pattern 116 stacked in sequence. Here, the gate patterns 120 are formed to go through the active region 106. Next, impurity ions are doped by using the gate patterns 120 as an ion implant mask to form impurity regions 123, i.e., source and drain regions, in the semiconductor substrate 100. The gate 113 is formed of an N-doped poly silicon layer or a polycide layer, and the gate capping layer pattern 116 is formed of a silicon nitride layer. Also, the gate insulating layer 110 is formed of an oxide layer. Subsequently, gate spacers 126 are formed on side walls of the gate patterns 120, and then pad interlayer insulating layers 129 are formed to fill a gap region of the gate patterns 120 and expose upper surfaces of the gate capping layer patterns 116. The gate spacers 126 are formed of a silicon nitride layer. The pad interlayer insulating layer 129 and the gate insulating layer 110 are etched to form pad holes 130 that penetrate a predetermined region between the gate patterns 120. Landing pads 133 are formed to fill the pad holes 130. The pad interlayer insulating layer 129 is formed of an oxide layer, and the landing pads 133 are formed of a N-doped poly silicon layer.

Referring to FIGS. 1, and 6 to 9, a bit line interlayer insulating layer 136 is formed over the whole surface of the semiconductor substrate 100 having the landing pads 133. A bit line layer 138 and a bit line capping layer 140 are sequentially formed on the bit line interlayer insulating layer 136. By using the bit line interlayer insulating layer 136 as an etching buffer layer, the bit line layer 138 and the bit line capping layer 140 are patterned into bit line patterns 143 through a photolithography and etching processes. Each of the bit line patterns 143 is formed from a bit line 139 and a bit line capping layer pattern 141 stacked thereon. The bit line patterns 143 are formed in a direction perpendicular to the gate patterns 120. Also, the bit line patterns 143 are formed on the bit line interlayer insulating layer 136 corresponding to portions between the landing pads 133. The bit line 139 is formed of an N-doped poly silicon layer, a polycide layer or a metal layer, and the bit line capping layer pattern 141 is formed of a silicon nitride layer. The bit line 139 has an etching selectivity ratio different from the landing pads 133.

Referring to FIGS. 1 and 10–13, a buried contact interlayer insulating layer 146 is formed over the whole surface of the semiconductor substrate 100 having the bit line patterns 143. The buried contact interlayer insulating layer 146 is formed of an oxide layer having an etching selectivity ratio different to the bit line interlayer insulating layer 136. Here, the bit line interlayer insulating layer 136 is preferably formed of an oxide layer having an etching selectivity ratio higher than the buried contact interlayer insulating layer 146. Then, buried contact holes 149 are formed in the buried contact interlayer insulating layer 146 and the bit line interlayer insulating layer 136 by a photolithography and etching processes. The buried contact holes 149 are formed in predetermined regions between the bit line patterns 143 to expose the landing pads 133. The buried contact holes 149 are self-aligned contact holes formed by using the bit line patterns 146.

Referring to FIGS. 1 and 14–17, the buried contact interlayer insulating layer 146 and the bit line interlayer insulating layer 136 are etched through the buried contact hole 149 to thereby form enlarged contact holes 150. Here, each of the enlarged contact holes 150 exposes at least one of side walls of the two bit line patterns 143 adjacent thereto. In the etching process for forming the enlarged contact hole 150, the bit line pattern 143 has the same etching selectivity ratio as the buried contact interlayer insulating layer 146 and the bit line interlayer insulating layer 136, and the enlarged contact holes 150 are isotropically etched by using a wet- or a dry-etching technique. Here, since at least one of the bit line patterns 143 is etched, a diameter of each of the enlarged contact holes 150 is larger than a distance between the bit line patterns 143 adjacent thereto.

Next, the buried contact interlayer insulating layer 146 and the bit line interlayer insulating layer 136 are sequentially etched through the enlarged contact holes 150 to thereby form buried and enlarged contact holes 153. The buried and enlarged contact holes 153 are formed by further removing one side portion of the bit line interlayer insulating layer 136 below the bit line pattern 143. The etching process through the enlarged contact holes 150 is performed by using an isotropic etching technique and has an etching selectivity ratio to the bit line interlayer insulating layer 136 higher than the bit line pattern 143 and the buried contact interlayer insulating layer 146. Therefore, the buried and enlarged contact holes 153 are contact holes that are etched by a specified amount A more than the enlarged contact holes 150. Also, the etching process for forming the buried and enlarged contact holes 153 can be isotropically performed by a wet or a dry etching technique. The buried and enlarged contact hole 153 is larger in diameter than the enlarged contact hole 150, and the enlarged contact hole 150 is larger in diameter than the buried contact hole.

Buried and enlarged contact hole spacers 156 are formed to cover side walls of the buried and enlarged contact holes 153. The buried and enlarged contact hole spacers 156 are formed of the same insulating layer as the gate spacer 126, such as a silicon nitride layer.

Referring to FIGS. 1 and 18–21, a buried and enlarged contact hole plug layer 159 is formed to fill the buried and enlarged contact holes 153 surrounded by the buried and enlarged contact hole spacers 156 and cover an upper surface of the buried contact interlayer insulating 146. The buried and enlarged contact hole plug layer 159 is formed of an N-doped poly silicon layer. Next, the buried and enlarged contact hole plug layer 156 is etched to thereby form buried and enlarged contact hole plugs 160 that fill the buried and enlarged contact holes 153. Here, the buried and enlarged contact hole plugs 160 are electrically connected to the landing pads 133 through the buried and enlarged contact holes 153.

As described herein before, the invention discloses the buried and enlarged contact holes formed in predetermined regions between the bit line patterns suitable for coping with reductions of a design rule. Each of the buried and enlarged contact holes has a diameter larger than a distance between the two adjacent bit line patterns. Therefore, since the semiconductor device having the buried and enlarged contact holes can maintain the same contact resistance between the buried contact hole plugs and the landing pads as before the reduction of the design rule and thus can meet a design performance that requires a high integration and a high speed.

Embodiments of the invention will now be described in a non-limiting way.

Embodiments of the invention provide a semiconductor device having a buried and enlarged contact hole and a method of fabricating the same.

According to some embodiments of the invention, there is provided a semiconductor device that includes a bit line interlayer insulating layer placed over a semiconductor substrate. Two adjacent bit line patterns are placed in parallel on the bit line interlayer insulating layer and each of the two adjacent bit line patterns includes a bit line and a bit line capping layer pattern stacked thereon. A buried contact interlayer insulating layer covers the whole surface of the semiconductor substrate having the two adjacent bit line patterns. A buried and enlarged contact hole is placed in a portion between the bit line patterns to penetrate the buried contact interlayer insulating layer and the bit line interlayer insulating layer and exposing at least one side wall of the bit line patterns. A buried and enlarged contact hole spacer covers a side wall of the buried and enlarged contact hole. A buried and enlarged contact hole plug is placed on the buried and enlarged contact hole spacer and fills the buried and enlarged contact hole.

In accordance with some embodiments of the invention, there is provided a method of fabricating a semiconductor device that includes forming a bit line interlayer insulating layer over a semiconductor substrate. Two adjacent bit line patterns are formed in parallel on the bit line interlayer insulating layer and each of the two adjacent bit line patterns is formed from a bit line and a bit line capping layer pattern stacked in sequence. A buried contact interlayer insulating layer is formed over the whole surface of the semiconductor substrate having the two adjacent bit line patterns. A buried contact hole is formed in a predetermined region of the buried contact interlayer insulating layer and the bit line interlayer insulating layer to expose the semiconductor substrate between the two adjacent bit line patterns. The buried contact interlayer insulating layer and the bit line interlayer insulating layer are etched through the buried contact hole to form an enlarged contact hole that exposes at least one side wall of the two adjacent bit line patterns. The buried contact interlayer insulating layer and the bit line interlayer insulating layer are subsequently etched through the enlarged contact hole to form a buried and enlarged contact hole that removes one side portion of the bit line interlayer insulating layer below the two adjacent bit line patterns. A buried and enlarged contact hole spacer is formed on the side wall of the buried and enlarged contact hole. A buried and enlarged contact hole plug fills the buried and enlarged contact hole that is surrounded by the buried and enlarged contact hole spacer.

While the invention has been particularly shown and described with reference to exemplary embodiments thereof, it will be understood by those skilled in the art that the foregoing and other changes in form and details may be made therein without departing from the spirit and scope of the invention as defined in the following claims.

The invention claimed is:

1. A method of fabricating a semiconductor device, comprising:

forming a bit line interlayer insulating layer over a semiconductor substrate;

forming two bit line patterns adjacent to and in parallel with each other on the bit line interlayer insulating layer, each of the two bit line patterns including a bit line and a bit line capping layer pattern stacked in sequence;

forming a buried contact interlayer insulating layer over a surface of the semiconductor substrate having the two bit line patterns;

forming a first contact hole in a predetermined region of the buried contact interlayer insulating layer and the bit line interlayer insulating layer between the two bit line patterns;

etching the buried contact interlayer insulating layer and the bit line interlayer insulating layer through the first contact hole to form a second contact hole that exposes at least one side wall of the two adjacent bit line patterns;

etching the buried contact interlayer insulating layer and the bit line interlayer insulating layer through the second contact hole to form a third contact hole that removes one side portion of the bit line interlayer insulating layer below the two adjacent bit line patterns;

forming a contact hole spacer on the side wall of the third contact hole; and forming a contact hole plug that fills the third contact hole and is surrounded by the contact hole spacer.

2. The method of claim 1, wherein forming the bit line interlayer insulating layer comprises forming an oxide layer having an etching selectivity ratio to the buried contact interlayer insulating layer.

3. The method of claim 1, wherein etching the buried contact interlayer insulating layer and the bit line interlayer insulating layer through the first contact hole comprises isotropically etching the buried contact interlayer insulating layer, the bit line patterns, and the bit line interlayer insulating layer at the same etching selectivity ratio.

4. The method of claim 1, wherein etching the buried contact interlayer insulating layer and the bit line interlayer insulating layer through the second contact hole comprises isotropically etching the buried contact interlayer insulating layer, the bit line patterns, and the bit line interlayer insulating layer, an etching selectivity ratio to the bit line interlayer insulating layer greater than the bit line patterns and the buried contact interlayer insulating layer.

5. The method of claim 1, wherein forming the third contact hole spacer comprises forming a silicon nitride layer.

6. The method of claim 1, wherein forming the third contact hole comprises forming the third contact hole to a diameter that is greater than the second contact hole, and forming the second contact hole comprises forming the second contact hole to a diameter that is greater than the first contact hole.

7. The method of claim 1, wherein forming the contact hole plug comprises forming an N-doped poly silicon layer.

8. The method of claim 1, further comprising, before forming the bit line interlayer insulating layer:

forming two adjacent gate patterns, each of the gate patterns including a gate and a gate capping layer pattern stacked in sequence over the semiconductor substrate;

forming a pad interlayer insulating layer on the semiconductor substrate having the gate patterns;

forming a pad contact hole between the gate patterns to penetrate a predetermined region of the pad interlayer insulating layer; and forming a landing pad filling the pad contact hole, wherein the first contact hole exposes an upper surface of the landing pad.

9. The method of claim 8, wherein forming the pad interlayer insulating layer comprises forming an oxide layer.

10. A method comprising:

sequentially depositing a first layer, a second layer, and a third layer;

patterning the second layer and the third layer to produce two bit line patterns, the bit line patterns parallel with each other;

depositing a fourth layer that covers the two bit line patterns;

removing first portions of the fourth layer and the first layer between the two bit line patterns to form a first contact hole;

removing second portions of the fourth layer and the first layer between a sidewall of the first contact hole and a sidewall of at least one of the two bit line patterns to form a second contact hole that exposes the sidewall of the at least one of the two bit line patterns;

removing a third portion of the first layer on a sidewall of the second contact hole beneath the two bit line patterns to form a third contact hole;

depositing a contact hole spacer on a sidewall of the third contact hole; and depositing a contact hole plug that fills the third contact hole.

11. The method of claim 10, wherein depositing the first layer comprises depositing an oxide layer that has an etching selectivity ratio to the fourth layer.

12. The method of claim 10, wherein removing second portions of the fourth layer and the first layer comprises isotropically etching the fourth layer, the at least one of the two bit line patterns, and the first layer at the same etching selectivity ratio.

13. The method of claim 10, wherein removing the third portion of the first layer comprises isotropically etching the fourth layer, the at least one of the two bit line patterns, and the first layer, an etching selectivity ratio to the first layer greater than an etching selectivity ratio to the fourth layer and the at least one of the two bit line patterns.

14. The method of claim 10, wherein depositing the contact hole spacer comprises depositing a silicon nitride layer.

15. The method of claim 10, wherein forming the third contact hole comprises enlarging a maximum diameter of the second contact hole, and wherein forming the second contact hole comprises enlarging a maximum diameter of the first contact hole.

16. The method of claim 10, wherein depositing the contact hole plug comprises depositing an N-doped polysilicon layer.

17. The method of claim 10, further comprising, before forming the first layer:

sequentially depositing a gate layer and a gate capping layer over a semiconductor substrate;

patterning the gate capping layer and the gate layer to form two gate patterns, the gate patterns parallel with each other;

depositing a pad interlayer insulating layer that covers the two gate patterns;

removing a portion of the pad interlayer insulating layer between the two gate patterns to form a pad contact hole that exposes the semiconductor substrate;

depositing a landing pad that fills the pad contact hole, wherein the first contact hole exposes an upper surface of the landing pad.

18. The method of claim 17, wherein depositing the pad interlayer insulating layer comprises depositing an oxide layer.

* * * * *